United States Patent [19]

Mauger

[11] Patent Number: 5,110,373
[45] Date of Patent: May 5, 1992

[54] SILICON MEMBRANE WITH CONTROLLED STRESS

[75] Inventor: Philip E. Mauger, Santa Clara, Calif.

[73] Assignee: Nanostructures, Inc., Mountain View, Calif.

[21] Appl. No.: 565,253

[22] Filed: Aug. 9, 1990

Related U.S. Application Data

[62] Division of Ser. No. 243,816, Sep. 13, 1988, Pat. No. 4,966,663.

[51] Int. Cl.$^5$ .......................................... H01L 29/84
[52] U.S. Cl. ..................... 148/33.2; 437/86; 437/901; 437/974; 437/966; 148/DIG. 159; 357/26
[58] Field of Search ............... 156/628, 657; 437/225, 437/901, 966, 974, 86; 148/DIG. 135, DIG. 159; 357/26

[56] References Cited

U.S. PATENT DOCUMENTS

| | | | |
|---|---|---|---|
| 4,234,361 | 11/1980 | Guckec et al. | 156/628 |
| 4,372,803 | 2/1983 | Gigante | 156/628 |
| 4,588,472 | 5/1986 | Shinizu | 156/628 |
| 4,618,397 | 10/1986 | Simizu et al. | 186/628 |
| 4,664,722 | 5/1987 | Hirata et al. | 204/129.3 |
| 4,946,735 | 8/1990 | Lee et al. | 156/628 |
| 4,952,446 | 8/1990 | Lee et al. | 156/628 |
| 4,978,421 | 12/1990 | Bassous et al. | 156/628 |

OTHER PUBLICATIONS

Yagi, K., "Anomalous Diffusion of Phosphorus into Silicon", Japanese Journal of Applied Physics, vol. 9, No. 3, 1970.

Hirata et al., "A Silica Diaphragm Formation" For Pressure Sensor By Analic Oxidation Etch Stop38, IEEE 1985.

Waggener, H., "Electrochemically Controlled Thinning of Silicon", B.S.T.J. Brief, Bell System Technical Journal, Mar. 1970.

Primary Examiner—Olik Chaudhuri
Assistant Examiner—G. Fourson

[57] ABSTRACT

A method for fabricating a silicon membrane with predetermined stress characteristics. A silicon substrate is doped to create a doped layer as thick as the desired thickness of the membrane. Stress within the doped layer is controlled by selecting the dopant based on its atomic diameter relative to silicon and controlling both the total concentration and concentration profile of the dopant. The membrane is then formed by electrochemically etching away the substrate beneath the doped layer.

3 Claims, 1 Drawing Sheet

SILICON MEMBRANE WITH CONTROLLED STRESS

This is a divisional of application Ser. No. 243816, filed Sep. 13, 1988 now U.S. Pat. No. 4,966,663.

FIELD OF THE INVENTION

This invention relates to the fabrication of silicon membranes and, particularly, to a method of fabrication wherein stress levels within the membrane may be carefully controlled.

BACKGROUND ART

Thin membranes of single crystal silicon are useful in a wide variety of applications. Some such applications include masks for X-ray lithographic exposures or integrated circuits, shadow or channeling masks for particle beams (such as ions or electrons), windows for atmospheric isolation, deformable optical and mechanical elements, sensors and transducers, and substrates for the fabrication of semiconductor devices.

Silicon wafers are conventionally produced by slicing thin discs of material from monocrystalline ingots. The discs are then thinned and polished using well known chem-mechanical grinding and polishing techniques. Wafers are commercially available in thicknesses ranging from 0.003 inches and up, with typical thicknesses being 0.015–0.025 inches. Below 0.003 inches in thickness, the chem-mechanical thinning techniques do not yield good results, and alternative chemical etching techniques are applied. Typically, the entire wafer is not thinned down since the result would be too fragile to handle. Instead, only portions of the wafer are thinned. The portions of the wafer which are not to be thinned are covered with an inert masking layer which protects such portions from the etching solution. The resultant structures, formed from chemically thinned silicon wafers, are referred to as membranes to distinguish them from the starting wafer material. These membranes are useful for applications that require thicknesses of silicon below that which can be achieved by chem-mechanical polishing, i.e. below approximately 0.003 inches.

The simplest procedure for forming a membrane from a silicon wafer is by a time down etching technique. In this process, the wafer is first covered with a masking layer on those portions of the wafer where etching is not desired. The wafer is then immersed in the etching solution, which begins to remove silicon from the unmasked areas. If the etch rate of the silicon in the solution being used is known, and if the etch rate is uniform over all areas of the wafer being etched, then the wafer can simply be immersed in the solution for the amount of time appropriate to reduce the wafer thickness to whatever is desired. The main drawbacks to this technique are that precise control of the etch rate and maintenance of high uniformity are difficult to achieve.

To solve the control problems associated with the time down approach, a variety of etch-stop techniques have been developed. The most commonly used technique is the p++ etch-stop. This technique relies on the fact that the etch rate of silicon in alkaline solutions drops substantially when the doping level of boron exceeds about $5 \times 10^{19}$ per $cm^3$. This technique has been described in U.S. Pat. No. 4,256,532 issued to Magdo, et al and in U.S. Pat. No. 4,589,952 issued to Behringer, et al. Use of this technique to create masks suitable for use with masked ion beam lithography is described by G. M. Atkinson, et al, "A Minimum Step Fabrication Process for the All-Silicon Channeling Mask, " Journal of Vacuum Science Technology, January/February 1987, pp. 219-222.

To form a membrane by the p++ etch-stop technique, a boron doped layer is formed on one surface of the silicon wafer. The wafer is then etched down starting from the other side. When the etching solution reaches the interface defined by the boron doped layer, the etching effectively stops due to the drop in etching rate. The thickness of the resulting membrane is then determined by the thickness of the boron doped layer. Since the maximum solubility of boron in silicon is about $1 \times 10^{20}$ per $cm^3$, this means that the boron doping level of the completed membrane must be in the range of approximately $0.5-1 \times 10^{20}$ per $cm^3$. A similar technique for fabricating a membrane by preferentially etching n+ silicon is disclosed in U.S. Pat. No. 3,713,922 issued to Lepselter, et al.

An alternative etch-stop technique is the p/n electrochemical etch-stop (ECE). In this case, a p/n junction is formed in the silicon wafer. Several well-known techniques for doing this are diffusion, ion implantation and epitaxy. By the application of an appropriate electrical voltage to the wafer, the etching of the silicon can be made to stop at the interface defined by the p/n junction. The thickness of the membrane is then determined by the location of the p/n junction.

The ECE technique is generally described by H. A. Waggener, "Electrochemically Controlled Thinning of Silicon," The Bell System Technical Journal, March, 1970, pp. 473-475. Enhancements to the original technique as described by Waggener include the use of other alkaline etchants to replace KOH (see T. N. Jackson, et al, "An Electrochemical P-N Junction Etch-Stop for the Formation of Silicon Microstructures," IEEE Electron Device Letters, Vol. EDL-2, No. 2, February 1981, pp. 44-45 and M. Hirata, et al, "A Silicon Diaphragm Formation for Pressure Sensor by Anodic Oxidation Etch-Stop," IEEE Conference Proceedings of Transducers 1985, June 1985, pp 287-290), and the use of multi-electrode biassing schemes (see U.S. Pat. No. 4,664,762 issued to Hirata and B. Kloek, et al, "A Novel Four Electrode Electrochemical Etch-Stop Method for Silicon Membrane Formation," IEEE Conference Proceedings of Transducers 1987, June 1987, pp. 116-119). The ECE technique can be used to produce large area membranes with good uniformity and precise thickness control.

Stress control is of importance in many membrane applications. As an example, a membrane with high tensile stress is desirable for X-ray masks. This permits the membrane to be made as flat as possible and improves its resistance to distortion when metal absorber patterns are applied to one surface. For shadow masks, a membrane of low but non-zero tensile stress is optimum. This keeps the membrane flat and but minimizes any distortion when the stencil holes are created.

The response of a membrane to a differential pressure across its two surfaces is also affected by its stress level. This is of importance in the use of membranes as windows or in some sensor applications. The resistance of the membrane to breakage due to mechanical vibrations, shocks or forces is also influenced by stress levels. Semiconductor device performance is also often a function of stress levels in the silicon material. Therefore, the suitability of a membrane for use in a semiconductor device would also be influenced by the membrane stress.

Several studies have been done on the effect of dopants on the stress levels in silicon wafers (see M. Sasiki, et al, "A Study of Strain in Ion Implanted Silicon," Semiconductor Processing, ASTM STP 850, American Society for Testing and Materials, 1984, pp. 96-109; N. Sato, "X-Ray Measurement of Lattice Strain Induced by Impurity Diffusion," Journal of the Physial Society of Japan, Vol. 38, No. 1, Jan. 1975, pp. 202-207; and K. Yagi, et al, "Anomalous Diffusion of Phosphorus into Silicon," Japanese Journal of Applied Physics, Vol. 9, No. 3, March 1970, pp 246-254). These studies have been related to the effects of any stress on the properties of the diffusion or implanted layer. In these studies X-ray analysis of doped wafers was performed to measure lattice strain for various dopant types and concentrations. This shows that the amount of strain induced depends on the size of the dopant atom. Boron and phosphorus, which are smaller than silicon, add tensile strain. Arsenic, which is almost the same size as silicon, adds only a small compressive strain. Larger atoms such as antimony add compressive strain. The strain increases with increasing dopant concentration until a maximum limit is reached. At this point, dislocations are created. Any additional dopant added at this point just causes more dislocations to be formed, rather than increasing the stress further. The aforementioned studies relate only to the effect of stress in bulk wafers, and do not discuss the implications of this physical effect for membrane fabrication.

SUMMARY OF THE INVENTION

One of the objects of this invention is to take advantage of a previously unrealized property of the ECE technique to produce membranes with controlled stress characteristics. This is accomplished by controlling the dopant species, the total dopant dose, and the dopant concentration profile.

A silicon membrane is formed by doping a silicon substrate to create a doped layer equal in thickness to the desired thickness of the membrane. The dopant species is selected according to whether tensile or compressive stress is desired. Atoms smaller than silicon are used to create tensile stress, whereas atoms larger than silicon are used to create compressive stress. The dopant concentration is then controlled to establish a predetermined level of stress in the doped layer. The dopant concentration may be uniform to establish isotropic stress within the membrane or many have a concentration profile in any one or more dimensions to establish a desired anisotropic stress pattern within the membrane.

After creation of the doped layer, a membrane is formed by etching away the silicon substrate beneath the desired area of the membrane using the electrochemical etch stop technique.

Post-etch adjustment of stress characteristics may be accomplished by introducing additional dopant of the same or a different species.

DETAILED DESCRIPTION OF THE PREFERRED EMBODIMENT

A method for fabricating a silicon membrane with predetermined stress characteristics is disclosed. In the following description, for purposes of explanation and not limitation, specific numbers, dimensions, materials, etc. are set forth in order to provide a thorough understanding of the present invention. However, it will be apparent to one skilled in the art that the present invention may be practiced without these specific details.

Figure 1A:
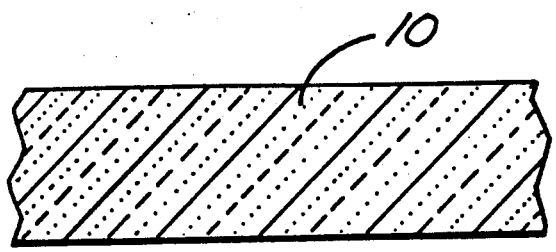
FIGS. 1a-1e are schematic representations of sequential processing steps that may be used to form a silicon membrane using the method of the present invention.

Referring first to FIG. 1a, the method of the present invention begins with a silicon wafer 10, either n or p-type depending on the dopant selected. A p-type wafer is used for n-type dopants and a n-type wafer with p-type dopants.

Figure 1B:
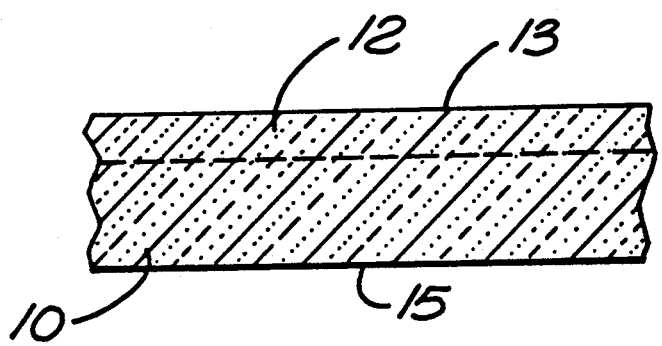

As shown in FIG. 1b, a doped layer 12 is formed using any of the standard doping techniques as are well known in the art (i.e. diffusion, ion implantation, or epitaxy). The selection of the dopant specie depends on the application and the stress level desired. Boron or phosphorus are suitable for achieving tensile stress, whereas antimony or tin are suitable for compressive stress. Arsenic, having an atomic diameter nearly equal to that of silicon, is useful for very low stress levels. The invention is not limited to these species, but comprehends any other atom with which a doped layer can be formed. The atoms named above constitute the common dopant atoms used in semiconductor manufacturing.

The stress level of the membrane is determined by the total dose of dopant added to the wafer, as given by the following formula:

$$\sigma = \beta[E/(1-\nu)](D/t) \quad (1)$$

Where:
The membrane stress is denoted by $\sigma$,
$\beta$ is the lattice contraction coefficient (which depends on the dopant species used),
E and $\nu$ are elastic constants of silicon, namely Young's modulus and Poisson's ratio respectively,
D is the total dose in atoms per $cm^2$, and
t is the membrane thickness.

The relationship expressed in equation (1) holds true as long as the stress remains below the level required to create dislocations. Furthermore, it will be understood that any additional extraneous sources of stress, such as atomic impurities or crystalline defects in the silicon, must be maintained at low levels. Equation (1) also assumes that the unetched portions of the silicon wafer are sufficiently rigid to prevent any warping of the structure.

The quantity (D/t) in equation (1) will be recognized as the average dopant concentration in the membrane. The formula shows that for a given specie, the range of stress levels possible is determined by the range of dopant concentrations possible. Recall that the ECE technique does not depend on the use of a particular dopant species or a narrow range of dopant concentrations as does the p++ etch-stop or other etching techniques. Therefore, the ECE technique is particularly well-suited for the making of stress controlled membranes.

Equation (1) above gives the expression for the average stress of the total membrane. In certain applications it is desirable to control not just the total stress in the membrane, but also the stress profile. As an example, one might want to make a membrane with the stress higher on one surface than on the other. This can be accomplished by depositing the dopant in such a way that its concentration is higher on one surface than the other. If the dopant concentration profile is not uniform throughout the membrane, then the stress will vary locally as determined by the local dopant concentration. The local stress (as a function of z=depth into the membrane) is given by the expression:

$$\sigma(z) = \beta[E/(1-\nu)]C(z) \qquad (2)$$

Where $C(z)$ is the dopant concentration as a function of depth and all other variables are as defined for equation (1).

Figure 1C:
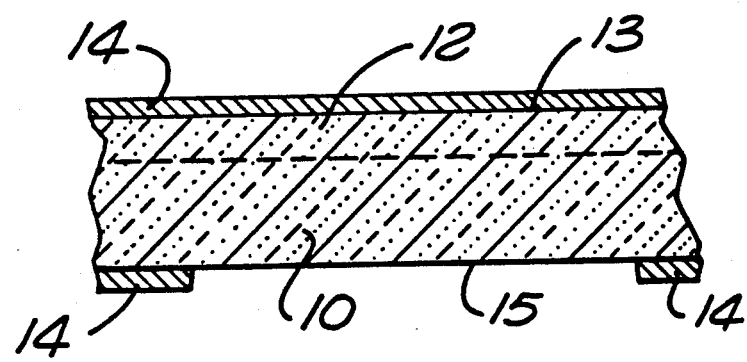
Figure 1D:
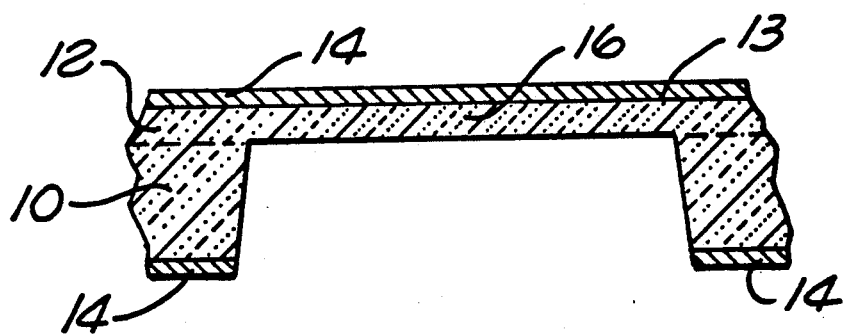
Figure 1E:
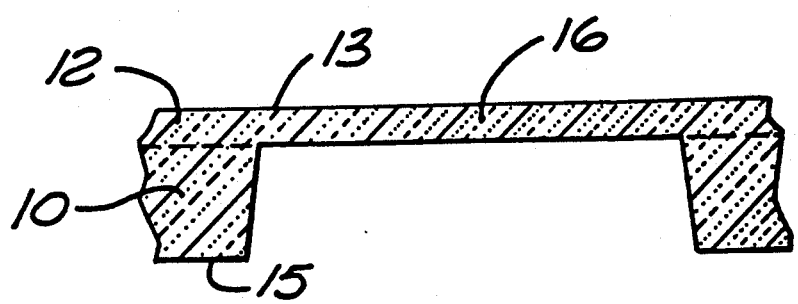

After the doped layer 12 is formed as described above, suitable masking 14 is applied to the substrate as shown in FIG. 1c. Masking 14 covers the entire surface 13 of doped layer 12 and those portions of opposite surface 15 except for the membrane area. The membrane 16 is then formed by etching the substrate underlying the membrane area using the well known ECE technique as illustrated in FIG. 1d. After etching is completed, masking 14 is removed by a solvent or other suitable means as shown in FIG. 1e.

After making the membrane 16, it is possible to adjust the stress level by the addition of more dopant atoms. This step can also be used with etch-stop techniques other than the ECE technique to adjust membrane stresses after the membranes are formed.

Yet another aspect of the invention is that it is also possible to vary the stress levels at different lateral locations on the wafer. Using standard doping techniques, it is possible to introduce different dopant species or obtain different dopant concentrations in different areas on the wafer. Therefore it is possible to form membranes with different stress levels on the same wafer, or to form a single membrane with stress that varies as a function of lateral position on the membrane.

EXAMPLES

1. A membrane of the thickness 2.8 microns was formed using a p-type silicon wafer diffused with phosphorus for a total dose of $3.8 \times 10^{15}$ atoms/cm$^2$. The measured stress was found to be $6.1 \times 10^7$ dynes per cm$^2$. The predicted value based on equation (1) is $6.0 \times 10^7$. This is based on using values of $1.5 \times 10^{12}$ dynes/cm$^2$ and $3.0 \times 1.0^{-24}$ cm$^3$/atom for the quantities $E/(1-\nu)$ and $\beta$ respectively.

2. A membrane of thickness 2.2 microns was formed using a p-type wafer with a phosphorus ion implant of $1.0 \times 10^{14}$ atoms/cm$^2$. The measured stress was below resolution limits of the equipment used for measurement (below $5 \times 10^6$ dynes/cm$^2$). This is consistent with the predicted value of $2.0 \times 10^6$.

3. A membrane of thickness 2.6 microns was formed using a p-type wafer with a phosporus ion implant of $1.0 \times 10^{16}$ atoms/cm$^2$. The measured stress was $1.3 \times 10^8$ dynes/cm$^2$ compared with a predicted value of $1.7 \times 10^8$.

It will be recognized that the above described invention may be embodied in other specific forms without departing from the spirit or essential characteristics of the disclosure. Thus, it is understood that the invention is not to be limited by the foregoing illustrative examples except as set forth in the appended claims.

I claim:

1. A stress-controlled silicon structure having a membrane comprising:
    a silicon substrate with a first electrical conductivity type, said substrate having first and second opposite surfaces;
    a doped layer adjacent to said first surface of said substrate having a dopant with a second electrical conductivity type, said doped layer having a non-uniform dopant concentration profile that varies as a function of lateral position on said first surface; and
    an electrochemically etched portion of said second surface of said substrate etched to a boundary of said doped layer, thereby forming said membrane with a thickness approximately equal to the thickness of said doped layer, said membrane having a pattern of internal stress that varies in accordance with the dopant concentration profile.

2. The silicon structure of claim 1 wherein said pattern of internal stress is tensile stress and wherein said dopant is selected from the group consisting of boron and phosphorus.

3. The silicon structure of claim 1 wherein said pattern of internal stress is compressive stress and wherein said dopant is selected from the group consisting of antimony and tin.

* * * * *